United States Patent
Lee et al.

(10) Patent No.: US 6,329,694 B1
(45) Date of Patent: Dec. 11, 2001

(54) SEMICONDUCTOR DEVICE WITH ESD PROTECTIVE CIRCUIT

(75) Inventors: Chang Hyuk Lee; Jae Goan Jeong, both of Kyungki-Do (KR)

(73) Assignee: Hyundai Electronics Industries Co., Inc., Kyungki-Do (KR)

( * ) Notice: Subject to any disclaimer, the term of this patent is extended or adjusted under 35 U.S.C. 154(b) by 0 days.

(21) Appl. No.: 09/342,102

(22) Filed: Jun. 29, 1999

(30) Foreign Application Priority Data

Jun. 30, 1998 (KR) .................................................. 98-25951

(51) Int. Cl.[7] .......................... H01L 29/74; H01L 29/76; H01L 23/62; H01L 29/00
(52) U.S. Cl. .......................... 257/372; 257/173; 257/355; 257/356; 257/357; 257/360; 257/546; 257/362; 257/174
(58) Field of Search ..................... 257/355, 356, 257/357, 360, 546, 371, 173, 174, 362, 378, 566, 567, 568, 327

(56) References Cited

U.S. PATENT DOCUMENTS

| | | |
|---|---|---|
| 5,159,426 * | 10/1992 | Harrington, III . |
| 5,218,222 | 6/1993 | Roberts . |
| 5,329,143 | 7/1994 | Chan et al. . |
| 5,336,908 | 8/1994 | Roberts . |
| 5,401,997 | 3/1995 | Lien . |
| 5,436,183 | 7/1995 | Davis et al. . |
| 5,450,267 | 9/1995 | Diaz et al. . |
| 5,571,737 | 11/1996 | Sheu et al. . |
| 5,610,426 | 3/1997 | Asai et al. . |
| 5,623,156 | 4/1997 | Watt . |
| 5,654,574 * | 8/1997 | Williams et al. ..................... 257/355 |
| 5,675,170 | 10/1997 | Kim . |
| 5,686,751 | 11/1997 | Wu . |
| 5,721,656 | 2/1998 | Wu et al. . |
| 5,728,612 * | 3/1998 | Wei et al. ............................. 438/200 |
| 5,742,083 | 4/1998 | Lin . |
| 5,804,861 * | 9/1998 | Leach ................................... 257/362 |
| 5,811,856 | 9/1998 | Lee . |
| 5,815,354 | 9/1998 | Braceras et al. . |
| 5,895,940 * | 4/1999 | Kim ..................................... 257/173 |
| 6,008,684 * | 12/1999 | Ker et al. ............................. 327/428 |
| 6,091,595 * | 7/2000 | Sharpe-Geisler ..................... 361/111 |
| 6,097,066 * | 8/2000 | Lee et al. ............................. 257/355 |
| 6,147,538 * | 11/2000 | Andresen et al. .................... 327/309 |

FOREIGN PATENT DOCUMENTS

| | | |
|---|---|---|
| 58-182861 | 10/1983 | (JP) . |
| 61-120459 | 6/1986 | (JP) . |
| 62-169456 | 7/1987 | (JP) . |
| 2-312268 | 12/1990 | (JP) . |
| 4-44262 | 2/1992 | (JP) . |
| 5-6964 | 1/1993 | (JP) . |
| 7-106522 | 4/1995 | (JP) . |
| 8-241967 | 9/1996 | (JP) . |

* cited by examiner

*Primary Examiner*—Alexander O. Williams
(74) *Attorney, Agent, or Firm*—Pennie & Edmonds LLP

(57) ABSTRACT

A semiconductor device with an electrostatic discharge (ESD) protective circuit is disclosed. In this semiconductor device with an ESD protective circuit, an n-well guard ring is formed around an NMOS field transistor of a data input buffer or around an NMOS transistor of a data output buffer. The n-well guard ring is strapped to an n-well of a PMOS field transistor and to an n-well of a PMOS transistor, and thus a PNPN path is formed toward the PMOS transistor at a positive mode of the ground voltage. Therefore, the electrical resistance between the wells of the NMOS transistors and the PMOS transistors can be reduced, thereby improving the characteristics of the ESD protective circuit and a latch-up device. Further the layout area is reduced, and thus, the characteristics and the reliability of the semiconductor device are improved.

7 Claims, 20 Drawing Sheets

SEMICONDUCTOR DEVICE WITH ESD PROTECTIVE CIRCUIT

BACKGROUND OF THE INVENTION

1. Field of the Invention

The present invention relates to a semiconductor device with an electrostatic discharge (ESD) protective circuit formed therein. Particularly, the present invention relates to an ESD protective circuit in which an n-well guard ring or an n$^+$ guard ring is formed around an NMOS field transistor of a data input buffer or around an NMOS transistor of a data output buffer, so as to strap the n-well guard ring or the n$^+$ guard ring to an n-well of a PMOS field transistor and to an n-well of a PMOS transistor, so that the electrical resistance between the wells of the NMOS transistor and the PMOS transistor can be reduced, thereby improving the characteristics of the ESD protective circuit and a latch-up device, and improving the characteristics and the reliability of the semiconductor device.

2. Description of the Prior Art

Generally, if a semiconductor device is exposed to an electrostatic discharge, its internal circuit is damaged, with the result that the semiconductor device shows malfunctions and causes a reliability problem.

Such a damage of the internal circuit is caused by the following mechanism. That is, if an electrostatic discharge occurs, the electric charges which have been injected through an input terminal move through the internal circuit to another terminal. Under this condition, due to the joule heat, junction spiking, oxide layer ruptures and the like occur.

In order to solve this problem, the charges which have been injected during the electrostatic discharge have to be dissipated toward the power supply terminal before the charges pass through the internal circuit. For this purpose, an ESD protective circuit has to be provided.

As shown in FIG. 1, an ESD protective circuit of an input pin consists of NMOS and PMOS transistors, this being one case. In FIG. 2, a data output driver consists of NMOS and PMOS transistors, this being another case. In all of these two cases, a gate diode is formed between a power voltage VCC and a ground voltage Vss. Thus if Vss is in a positive mode, the current of the NMOS transistor (which serves as a main bipolar transistor) is dispersed, and thus, the current is made to pass from a PMOS p$^+$ diffusion layer through an n-well to a PNPN path which is connected to a bipolar between Vcc and Vss. In this manner, the strength of the ESD protective circuit is reinforced.

However, in the semiconductor device with the above-described conventional ESD protective circuit, the current cannot sufficiently flow to the PNPN path due to the resistance of the Vcc power line. Further, an additional layout area is required owing to the provision of the gate diode between Vcc and Vss.

SUMMARY OF THE INVENTION

The present invention is intended to overcome the above-described disadvantages of the conventional techniques.

Therefore it is an object of the present invention to provide a semiconductor device with an ESD protective circuit, in which an n-well guard ring or an n$^+$ guard ring is formed around an NMOS field transistor of a data input buffer or around an NMOS transistor of a data output buffer, so as to connect the n-well guard ring or the n$^+$ guard ring to an n-well of a PMOS field transistor and to an n-well of a PMOS transistor and so as to carry out a strapping, so that the electrical resistance between the wells of the NMOS transistors and the PMOS transistors can be reduced, thereby improving the characteristics and the reliability of the semiconductor device.

In achieving the above object, the semiconductor device with an ESD protective circuit using a PMOS transistor and an NMOS transistor as the ESD protective circuit of a data output driver according to the present invention, includes: an n-well guard ring formed around the NMOS transistor, the n-well guard ring being strapped to an n-well of the PMOS transistor.

In another aspect of the present invention, the semiconductor device with an ESD protective circuit using a PMOS field transistor and an NMOS field transistor as an input ESD protective circuit according to the present invention, includes: an n-well guard ring formed around the NMOS field transistor, the n-well guard ring being strapped to an n-well of the PMOS field transistor.

In still another aspect of the present invention, the semiconductor device with an ESD protective circuit using a PMOS field transistor and an NMOS field transistor as an input ESD protective circuit according to the present invention, includes: a p$^+$ guard ring formed around the PMOS field transistor, the p$^+$ guard ring being strapped to an p$^+$ pick-up of the NMOS field transistor.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1:
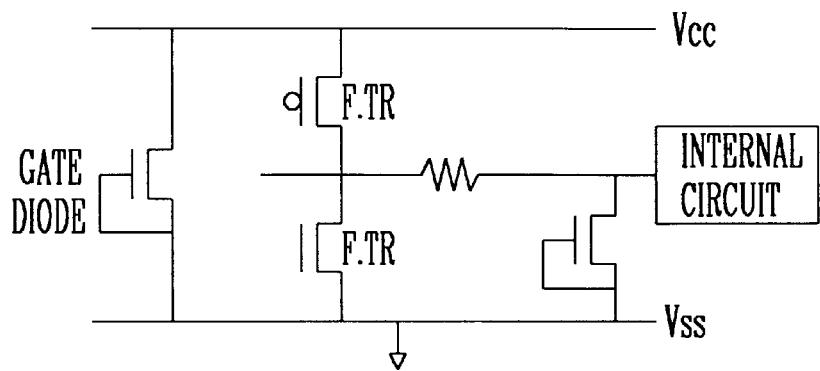
FIGS. 1 and 2 illustrates the conventional ESD protective circuits.
Figure 2:
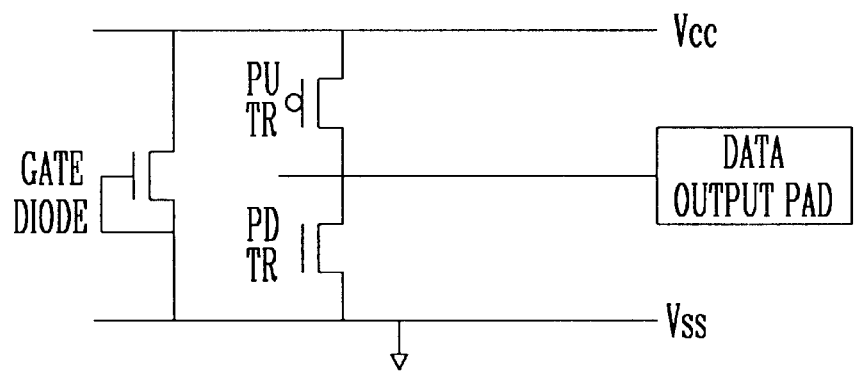
Figure 3:
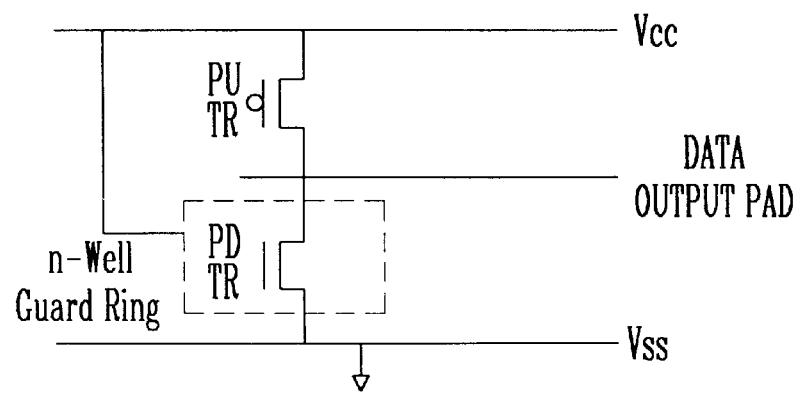
FIG. 3 illustrates a first embodiment of the ESD protective circuit according to the present invention.
Figure 6:
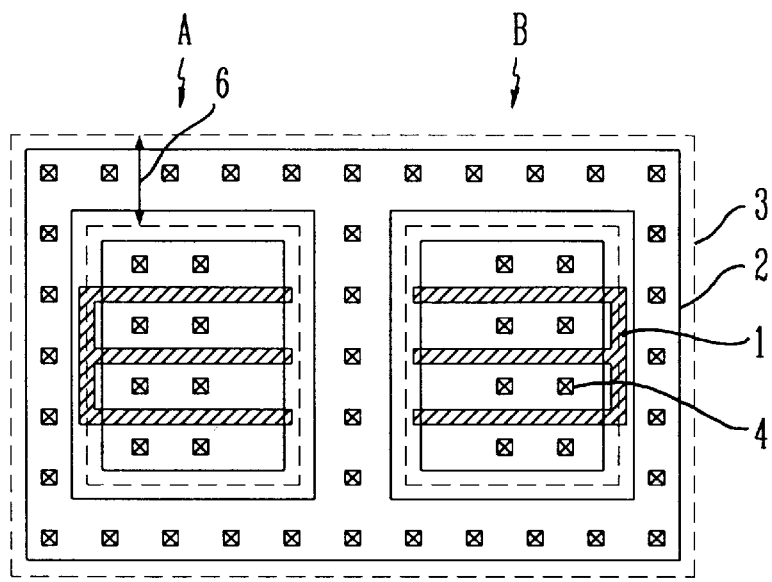
Figure 7:
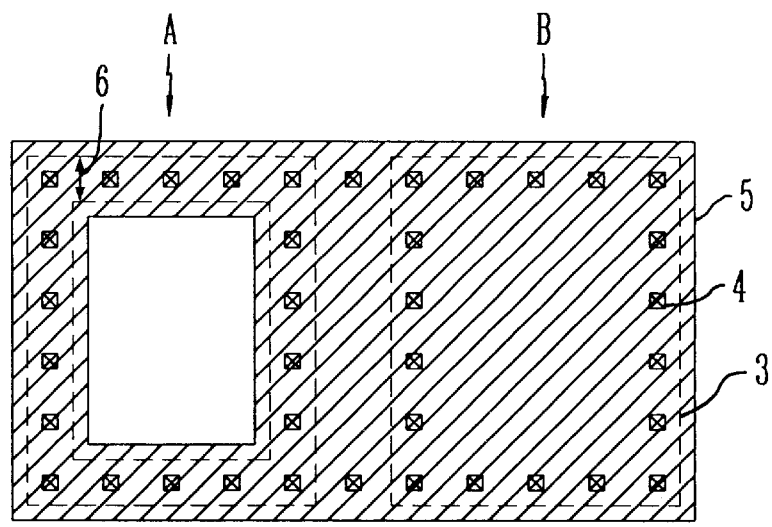

Referring to FIG. 3, a first embodiment of the ESD protective circuit according to the present invention is illustrated in this drawing. As shown in this drawing, a PMOS transistor is used as a pull-up driver of a data output buffer, and an NMOS transistor is used as a pull-down driver. Referring to FIG. 6, an n-well guard ring 6 is formed around a pull-down driver NMOS transistor A. As shown in FIG. 7, the n-well guard ring 6 and an n-well 3 of a pull-up driver PMOS transistor B are strapped together by using a metal 5. Reference number 1 indicates a gate electrode, 2 indicates an element isolating region, and 4 indicates a metal contact.

In the above, the n-well guard ring 6 around the pull-down driver NMOS transistor A can be substituted by a $n^+$ diffusion layer. In the case of a triple-well structure, the pull-down driver NMOS transistor can be substituted by an RMOS transistor. Further, the metal strapping can be carried out after a buffer is formed by using polycrystalline silicon or polycide. Or the metal strapping can be carried out directly by using the polycrystalline silicon or polycide.

Figure 4:
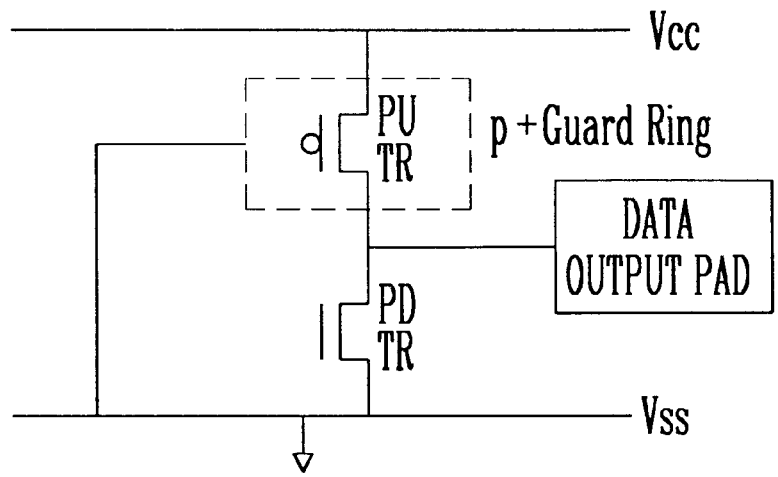
FIG. 4 illustrates a second embodiment of the ESD protective circuit according to the present invention.

FIG. 4 illustrates a second embodiment of the ESD protective circuit according to the present invention. As shown in this drawing, a PMOS transistor is used as a pull-up driver of a data output buffer, and an NMOS transistor is used as a pull-down driver. A $p^+$ guard ring is formed around the pull-up driver PMOS transistor, and the $p^+$ guard ring and a $p^+$ pick-up of the pull-down NMOS transistor are strapped together by using a metal.

In the above, the $p^+$ guard ring and the $p^+$ pick-up of the pull-down NMOS transistor do not have to be directly strapped, but may be simply connected with a metal. Further, the metal strapping can be carried out after a buffer is formed by using polycrystalline silicon or polycide. Or the metal strapping can be carried out directly by using the polycrystalline silicon or polycide.

FIGS. 8A to 8H illustrate a third embodiment of the ESD protective circuit according to the present invention.

Figure 5:
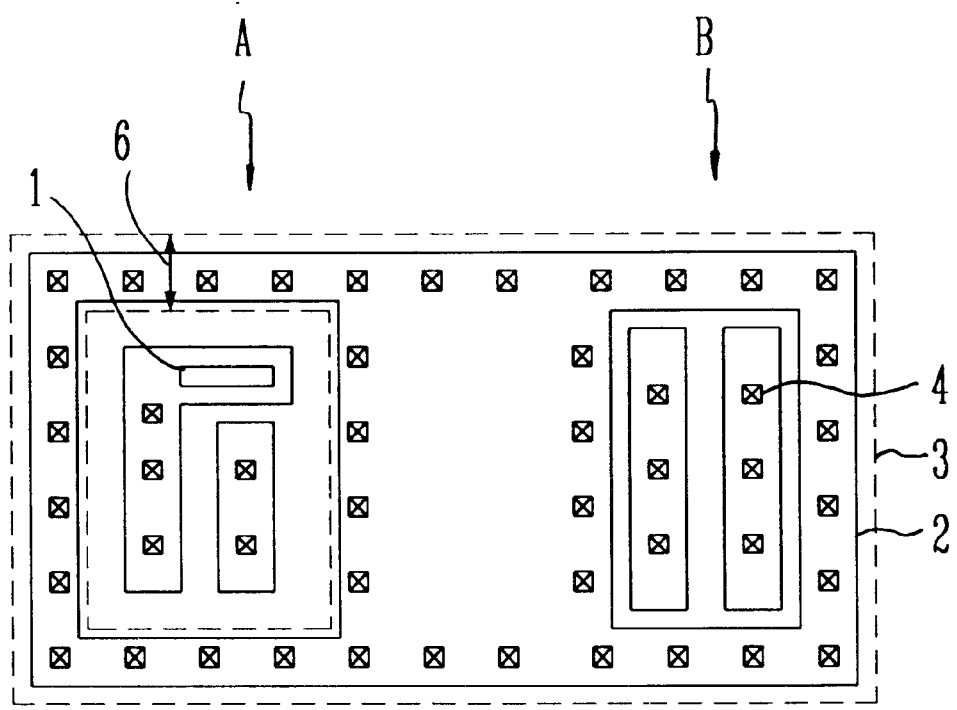
FIGS. 5 and 7 illustrates the layouts of the ESD protective circuit according to the present invention.
Figure 8A:
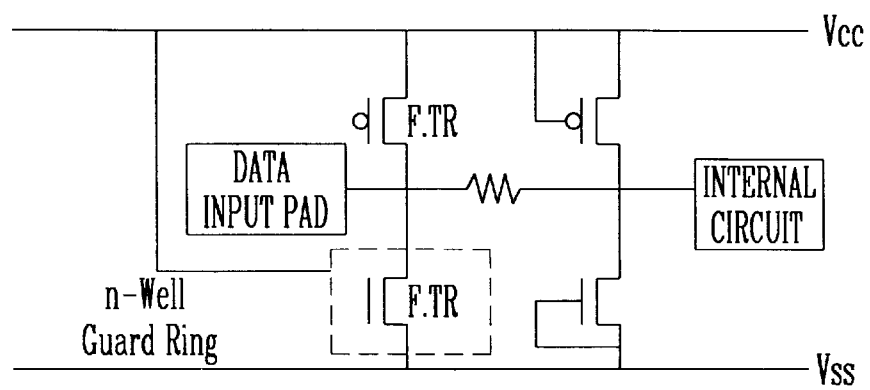
FIGS. 8A to 8H illustrate a third embodiment of the ESD protective circuit according to the present invention.

Referring to FIG. 8A, a PMOS field transistor and an NMOS field transistor are used, and a gate diode transistor is formed from an input pad through a resistor to Vss. Further, a gate diode transistor is used on the Vcc line, thereby forming input ESD protective circuit. As shown in FIG. 5, an n-well guard ring 6 is formed around the NMOS field transistor A, and as shown in FIG. 7, the n-well guard ring 6 and an n-well 3 of the PMOS transistor B are strapped together by using a metal 5.

In the above, the n-well guard ring 6 around the pull-down driver NMOS transistor A can be substituted by a $n^+$ diffusion layer. In the case of a triple-well structure, the pull-down driver NMOS transistor can be substituted by an RMOS transistor. Further, the metal strapping can be carried out after using polycrystalline silicon or polycide forms a buffer. Or the metal strapping can be carried out directly by using the polycrystalline silicon or polycide.

Figure 8B:
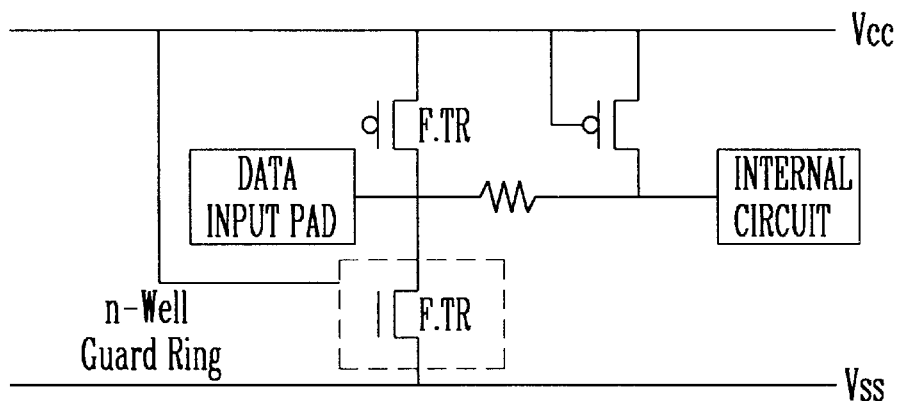
Figure 8C:
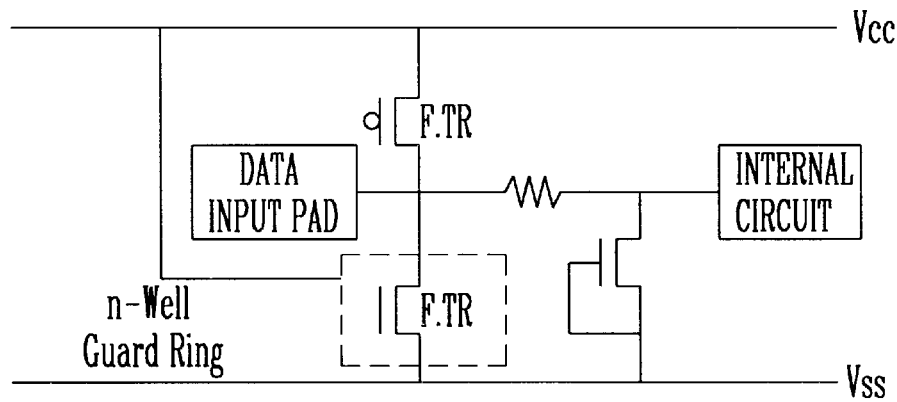

FIG. 8B illustrates the case where the gate diode transistor of Vss is eliminated from the input ESD protective circuit of FIG. 8A. FIG. 8C illustrates the case where the gate diode transistor of Vcc is eliminated from the input ESD protective circuit.

Figure 8D:
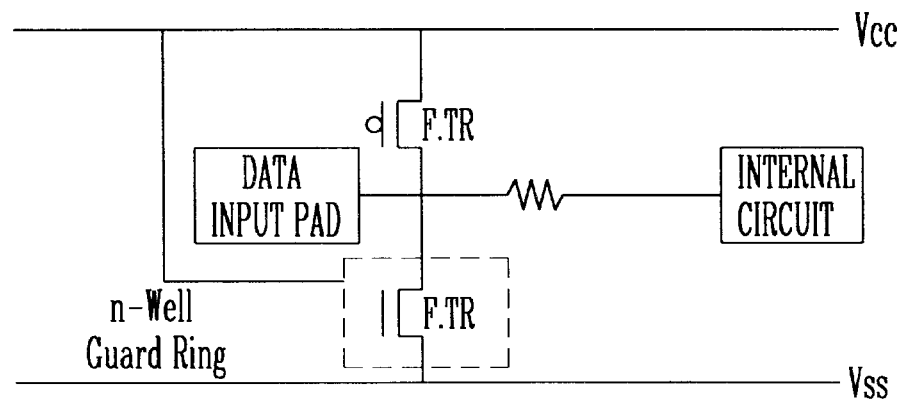

FIG. 8D illustrates the case where the gate diode transistor of Vss and the gate diode transistor of Vcc are eliminated from the input ESD protective circuit of FIG. 8A.

Figure 8E:
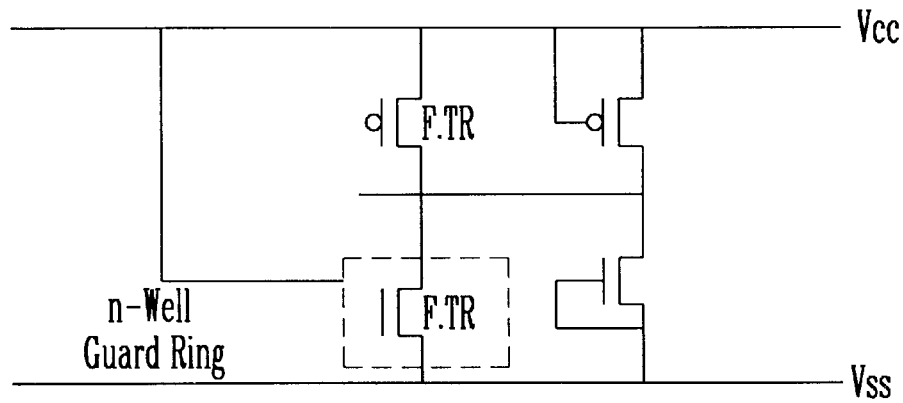

FIG. 8E illustrates the case where the resistor of the input pad is eliminated from the input ESD protective circuit of FIG. 8A.

Figure 8F:
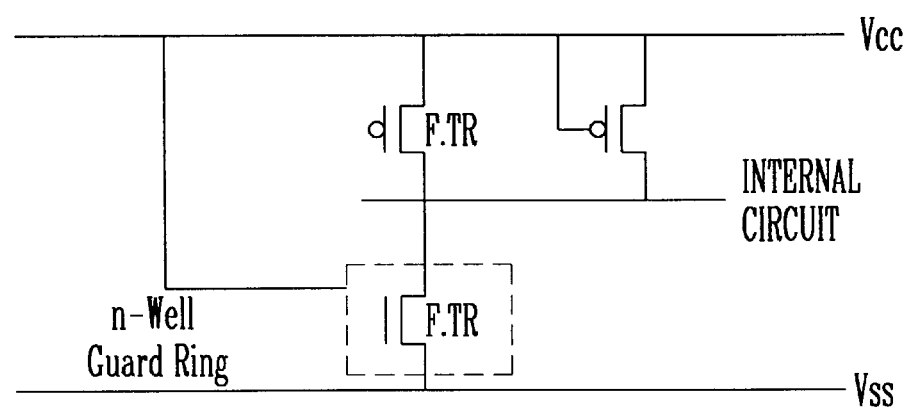
Figure 8G:
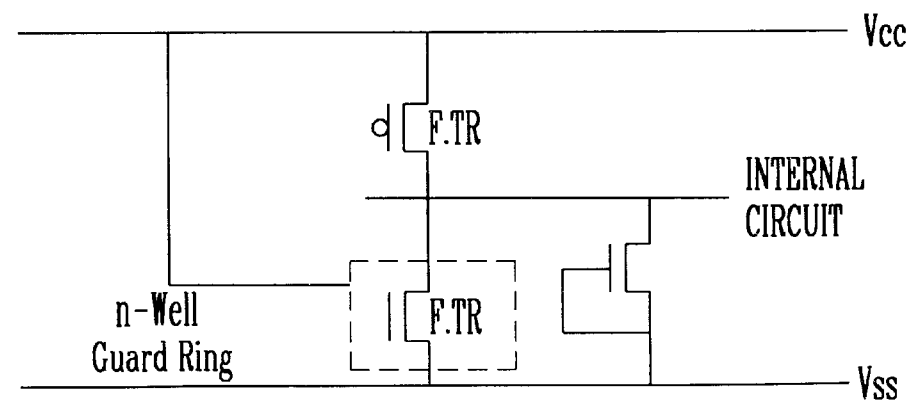

FIG. 8F illustrates the case where the gate diode transistor of Vss and the resistor of the input pad are eliminated from the input ESD protective circuit of FIG. 8A. FIG. 8G illustrates the case where the gate diode transistor of Vcc and the resistor of the input pad are eliminated from the input ESD protective circuit of FIG. 8A.

Figure 8H:
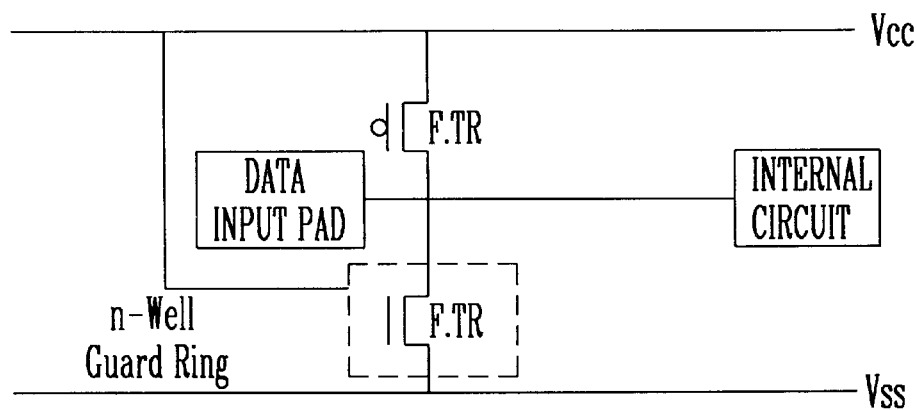

FIG. 8H illustrates the case where only the PMOS transistor and the NMOS transistor are used in the ESD protective circuit.

FIGS. 9A to 9h illustrate a fourth embodiment of the ESD protective circuit according to the present invention.

Figure 9A:
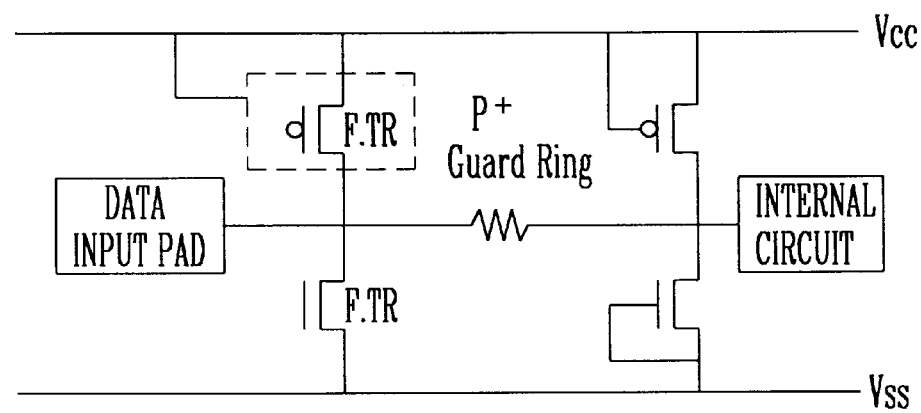
FIGS. 9A to 9H illustrate a fourth embodiment of the ESD protective circuit according to the present invention.

Referring to FIG. 9A, a PMOS field transistor and an NMOS field transistor are used, and a gate diode transistor is formed from an input pad through a resistor to Vss. Further, a gate diode transistor is used on the Vcc line, thereby forming an input ESD protective circuit. Further, a $p^+$ guard ring 6 is formed around the PMOS field transistor, and the $p^+$ guard ring 6 and a $p^+$ pick-up of the NMOS transistor are strapped together by using a metal 5.

In the case of a triple-well structure, the NMOS field transistor can be substituted by an RMOS field transistor. Further, the metal strapping can be carried out after a buffer is formed by using polycrystalline silicon or polycide. Or the metal strapping can be carried out directly by using the polycrystalline silicon or polycide.

Figure 9B:
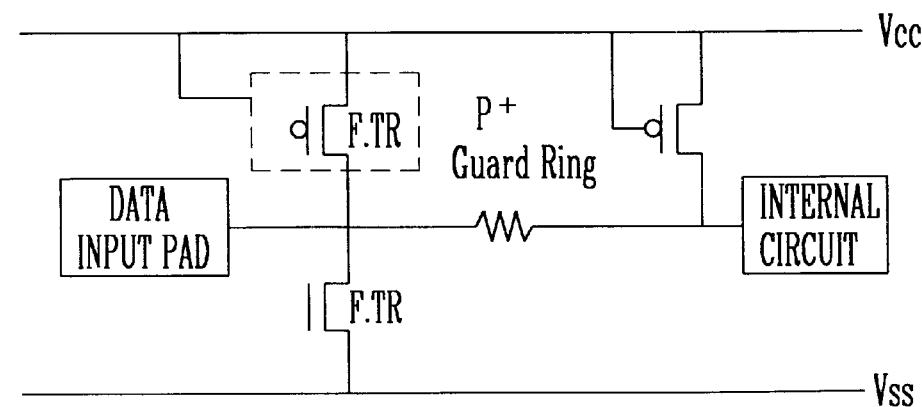
Figure 9C:
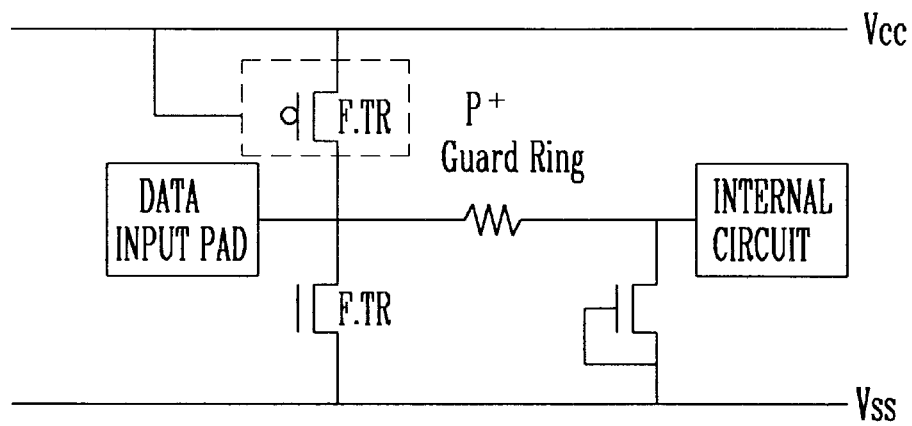

FIG. 9B illustrates the case where the gate diode transistor of Vss is eliminated from the input ESD protective circuit of FIG. 9A. FIG. 9C illustrates the case where the gate diode transistor of Vcc is eliminated from the input ESD protective circuit.

Figure 9D:
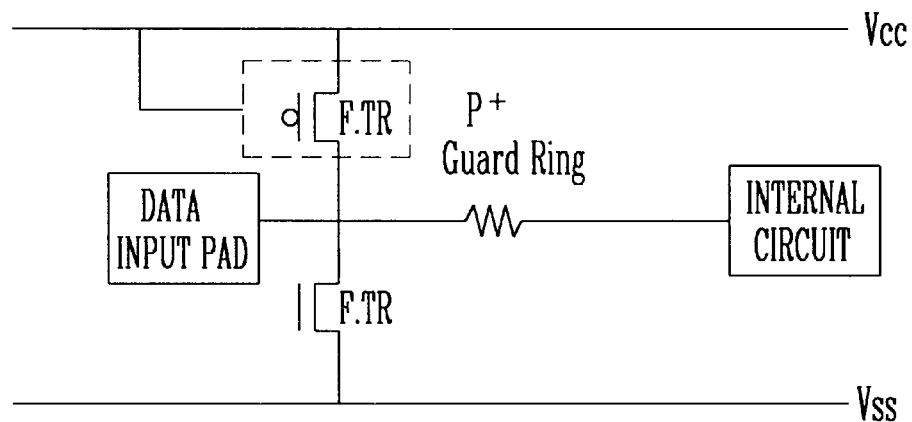

FIG. 9D illustrates the case where the gate diode transistor of Vss and the gate diode transistor of Vcc are eliminated from the input ESD protective circuit of FIG. 9A.

Figure 9E:
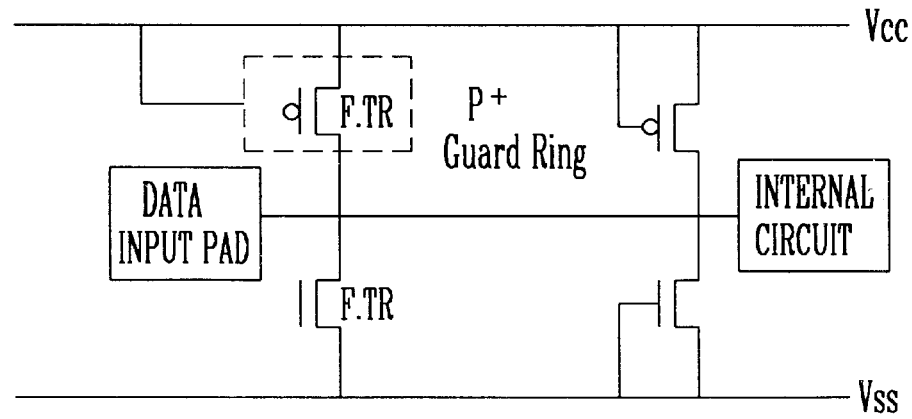

FIG. 9E illustrates the case where the resistor of the input pad is eliminated from the input ESD protective circuit of FIG. 9A.

Figure 9F:
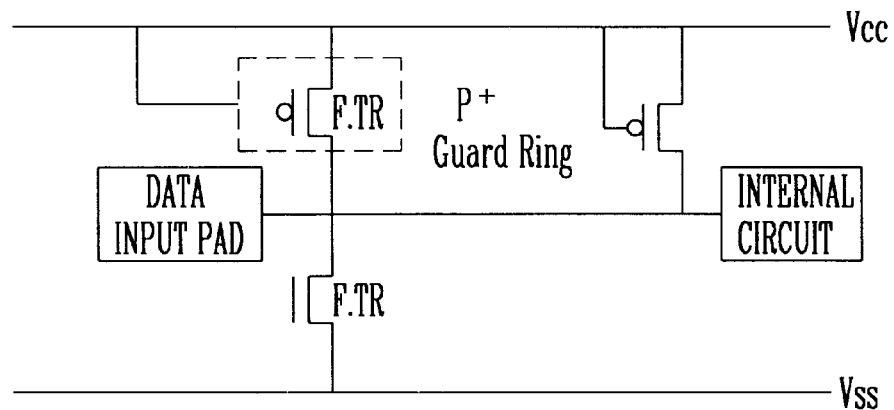
Figure 9G:
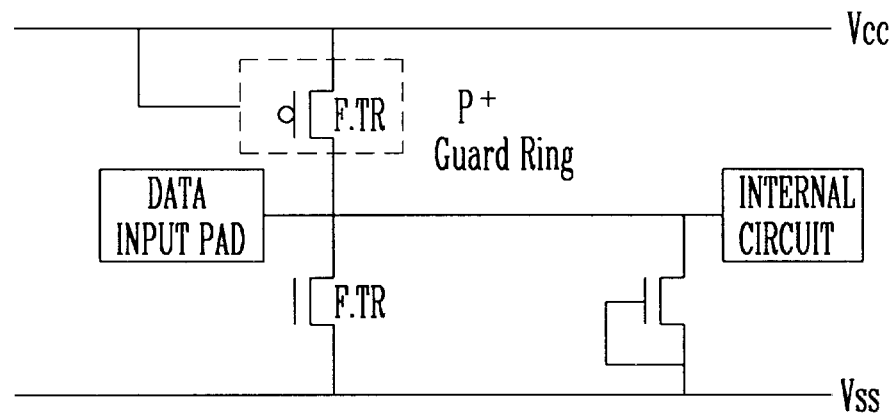

FIG. 9F illustrates the case where the gate diode transistor of Vss and the resistor of the input pad are eliminated from the input ESD protective circuit of FIG. 9A. FIG. 9G illustrates the case where the gate diode transistor of Vcc and the resistor of the input pad are eliminated from the input ESD protective circuit of FIG. 9A.

Figure 9H:
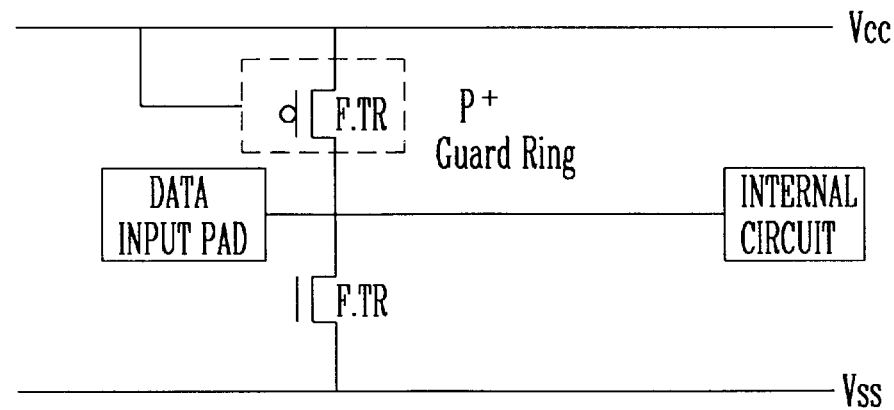

FIG. 9H illustrates the case where only the PMOS transistor and the NMOS transistor are used in the ESD protective circuit of FIG. 9A.

FIGS. 10 to 21 are sectional views showing the ESD protective circuit according to the present invention.

Figure 10:
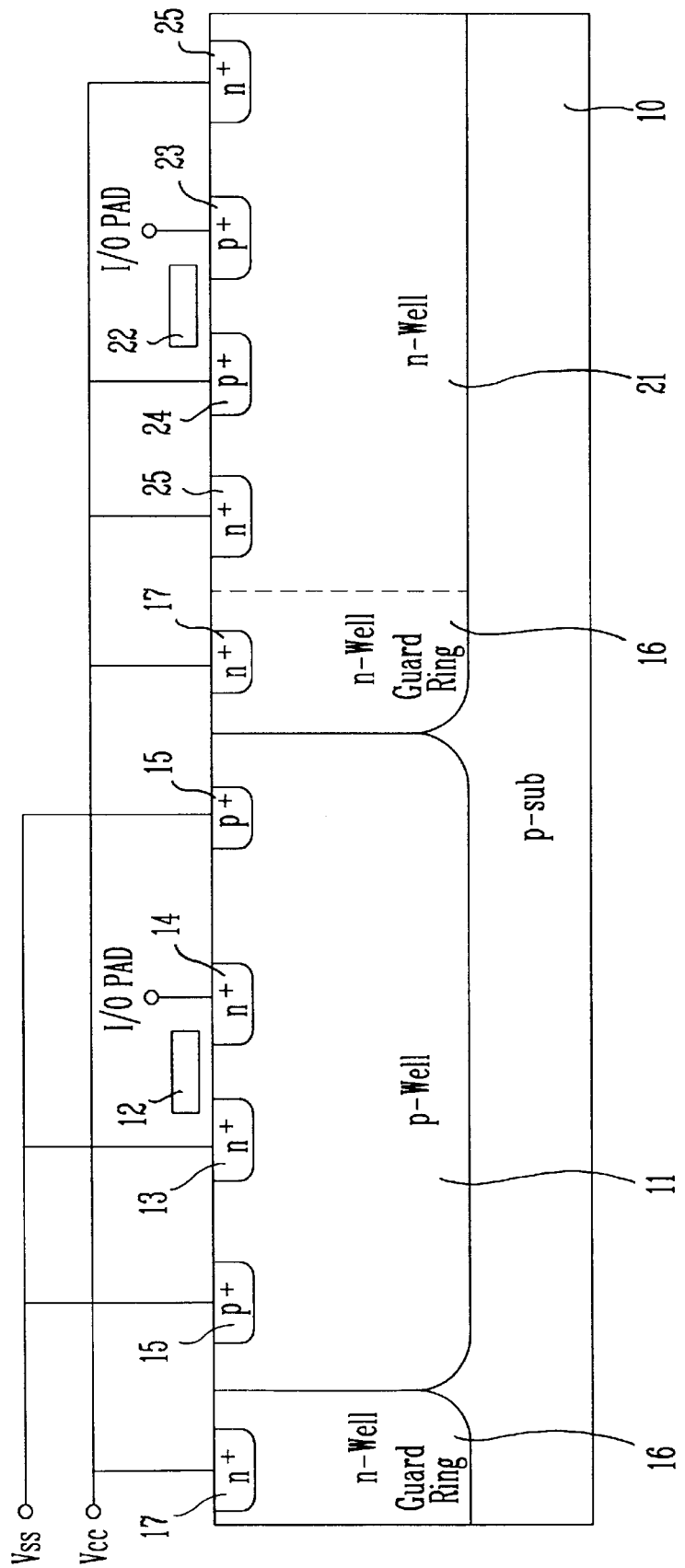
FIGS. 10–11 are sectional views of a structure consistent with the device of FIG. 3.
Figure 11:
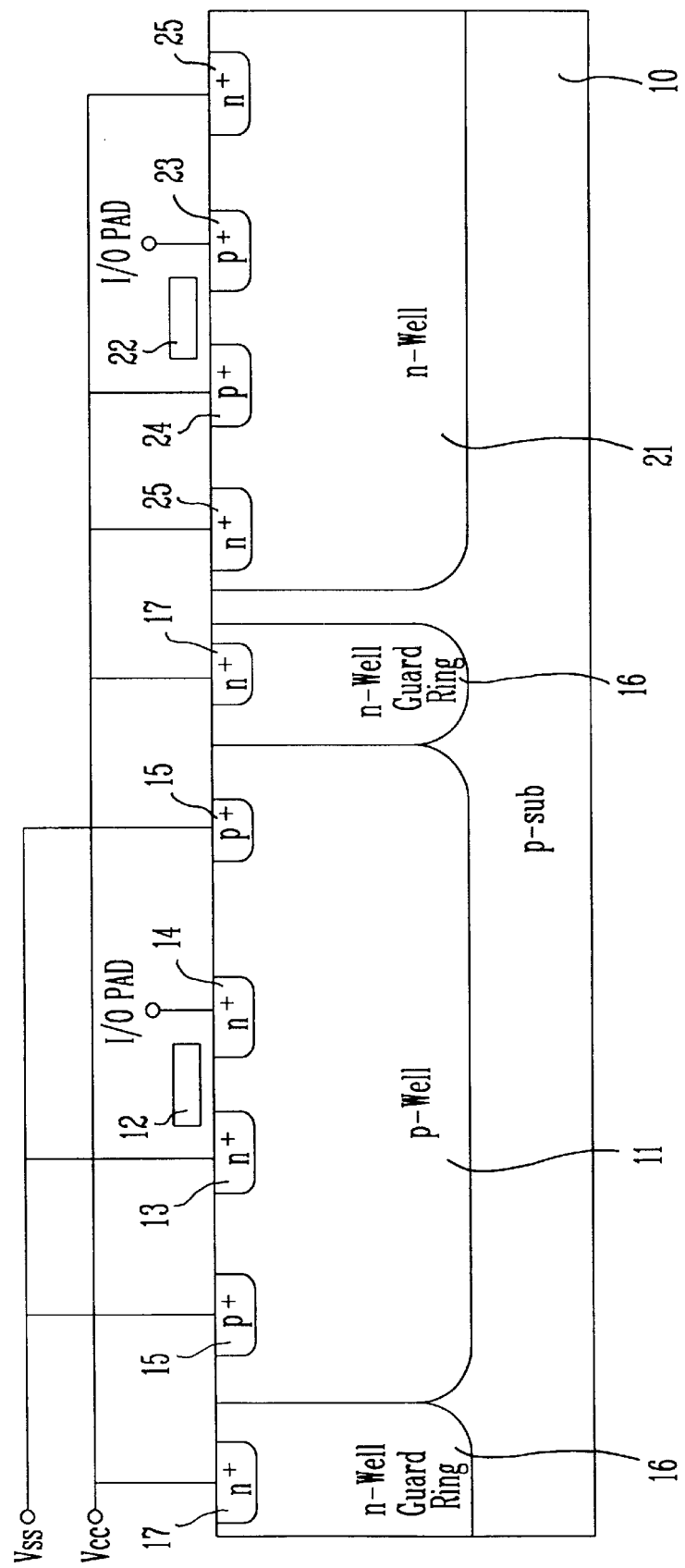

Referring to FIGS. 10 and 11, a p-well 11 and an n-well 21 are formed on a p-type semiconductor substrate 10. Then, a first gate electrode 12, a first source 13, a first drain 14 and a $p^+$ pick-up 15 are formed in the p-well 11, thereby forming an NMOS transistor. Then a second gate electrode 22, a second source 23, a second drain 24 and an $n^+$ pick-up 25 are formed in the n-well 21, thereby forming a PMOS transistor. Then an n-well guard ring 16 is formed around the p-well 11. The first drain 14 and the second source 23 are connected to an input/output pad (I/O pad). The first source 13 and the $p^+$ pick-up 15 are connected to a ground voltage Vss. At a positive mode of the ground voltage, an n-well guard ring 16 and the $p^+$ pick-up 25 are metal-strapped, in such a manner that a PNPN path should be formed toward the PMOS transistor. The n-well guard ring 16 and the $n^+$ pick-up 25 thus strapped and the second drain 24 are connected to the power source voltage Vcc.

In the above, the NMOS transistor is a pull-down NMOS transistor, and the PMOS transistor is a pull-up PMOS transistor. Or the NMOS transistor is an NMOS field transistor, and the PMOS transistor is a PMOS field transistor.

The n-well guard ring 16 is provided with a $n^+$ diffusion layer 17 for carrying out the metal strapping. Further, the n-well guard ring 16 is formed either simultaneously with the n-well 21, or is formed by doping a $n^+$ impurity separately from the n-well 21. The n-well guard ring 16 is formed either connected to the p-well 11 and the n-well 21, or is formed isolated from the n-well 21.

Figure 12:
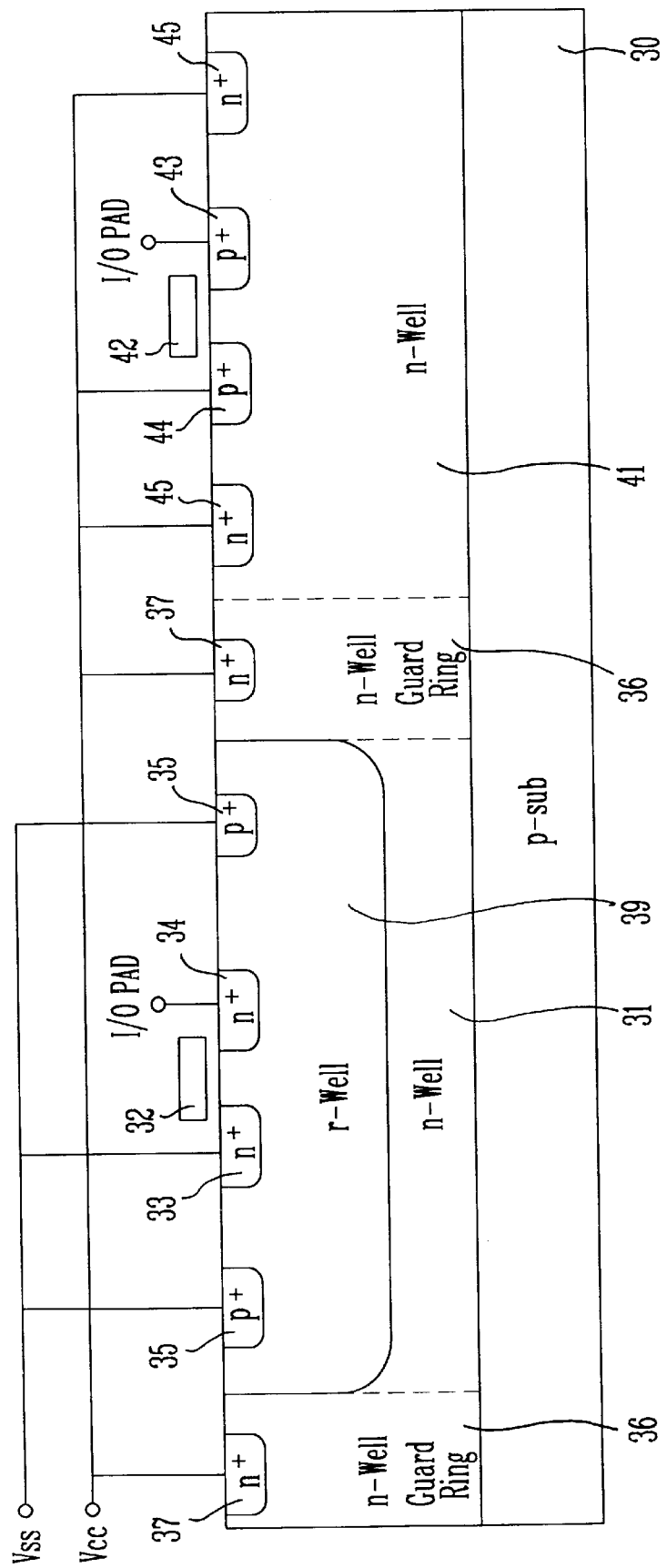
FIGS. 12–13 are sectional views of a structure consistent with the device of FIGS. 8A–8H.
Figure 13:
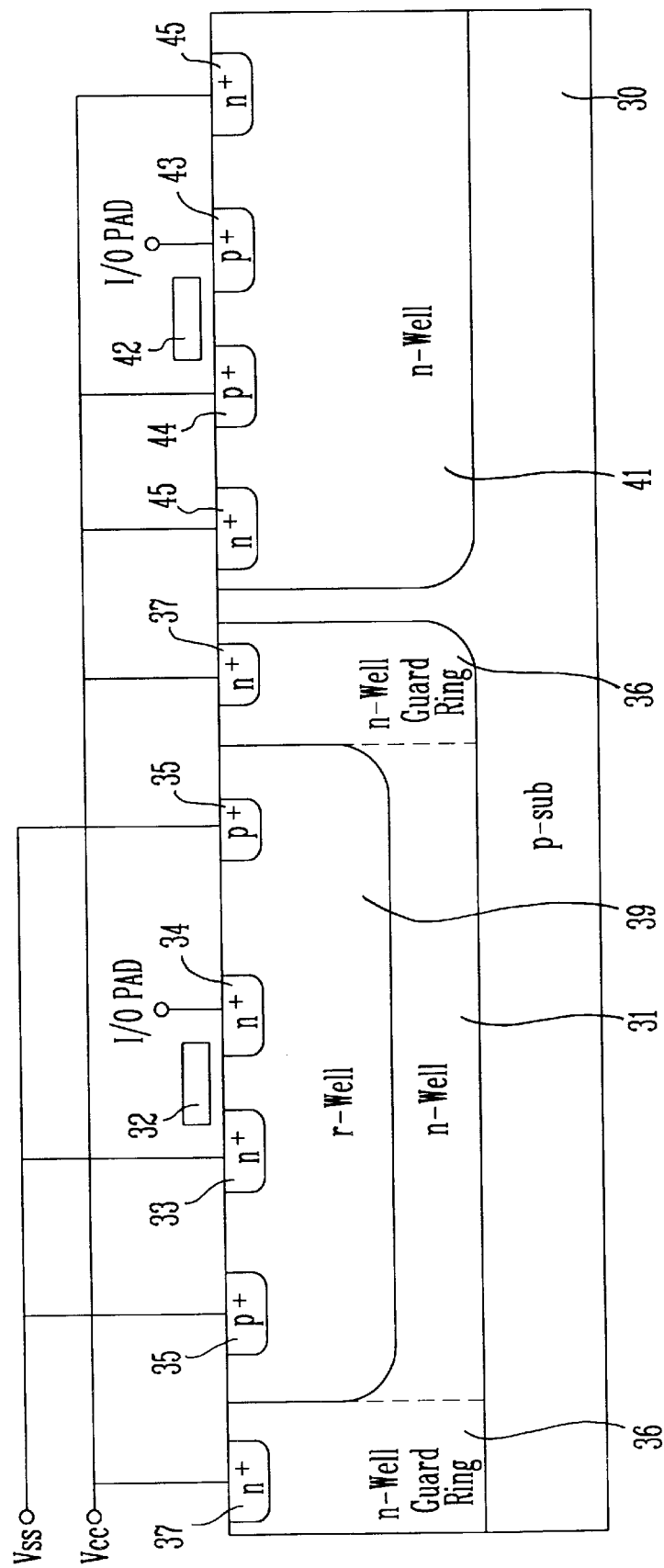

Referring to FIGS. 12 and 13, an r-well 39, a first n-well 31 and a second n-well 41 are formed on a p-type semiconductor substrate 30. Then, a first gate electrode 32, a first source 33, a first drain 34 and a p$^+$ pick-up 35 are formed in the r-well 39 in which the first n-well 31 has been formed, thereby forming an NMOS transistor. Then a second gate electrode 42, a second source 43, a second drain 44 and an n$^+$ pick-up 45 are formed in the second n-well 41, thereby forming a PMOS transistor. Then an n-well guard ring 36 is formed around the r-well 39. The first drain 34 and the second source 43 are connected to an input/output pad (I/O pad). The first source 33 and the p$^+$ pick-up 35 are connected to a ground voltage Vss. At a positive mode of the ground voltage, the n-well guard ring 36 and the n$^+$ pick-up 45 are metal-strapped, in such a manner that a PNPN path should be formed toward the PMOS transistor. The n-well guard ring 36 and the n$^+$ pick-up 45 thus strapped and the second drain 34 are connected to the power source voltage Vcc.

In the above, the NMOS transistor is a pull-down NMOS transistor, and the PMOS transistor is a pull-up PMOS transistor. Or the NMOS transistor is an NMOS field transistor, and the PMOS transistor is a PMOS field transistor.

The n-well guard ring 36 is provided with a n$^+$ diffusion layer 37 for carrying out the metal strapping. Further, the n-well guard ring 36 is formed either simultaneously with the second n-well 41, or is formed by doping a n$^+$ impurity separately from the second n-well 41. The n-well guard ring 36 is formed either connected to the first n-well/r-well 31 and 39 and the second n-well 41, or is formed isolated from the second n-well 41.

Figure 14:
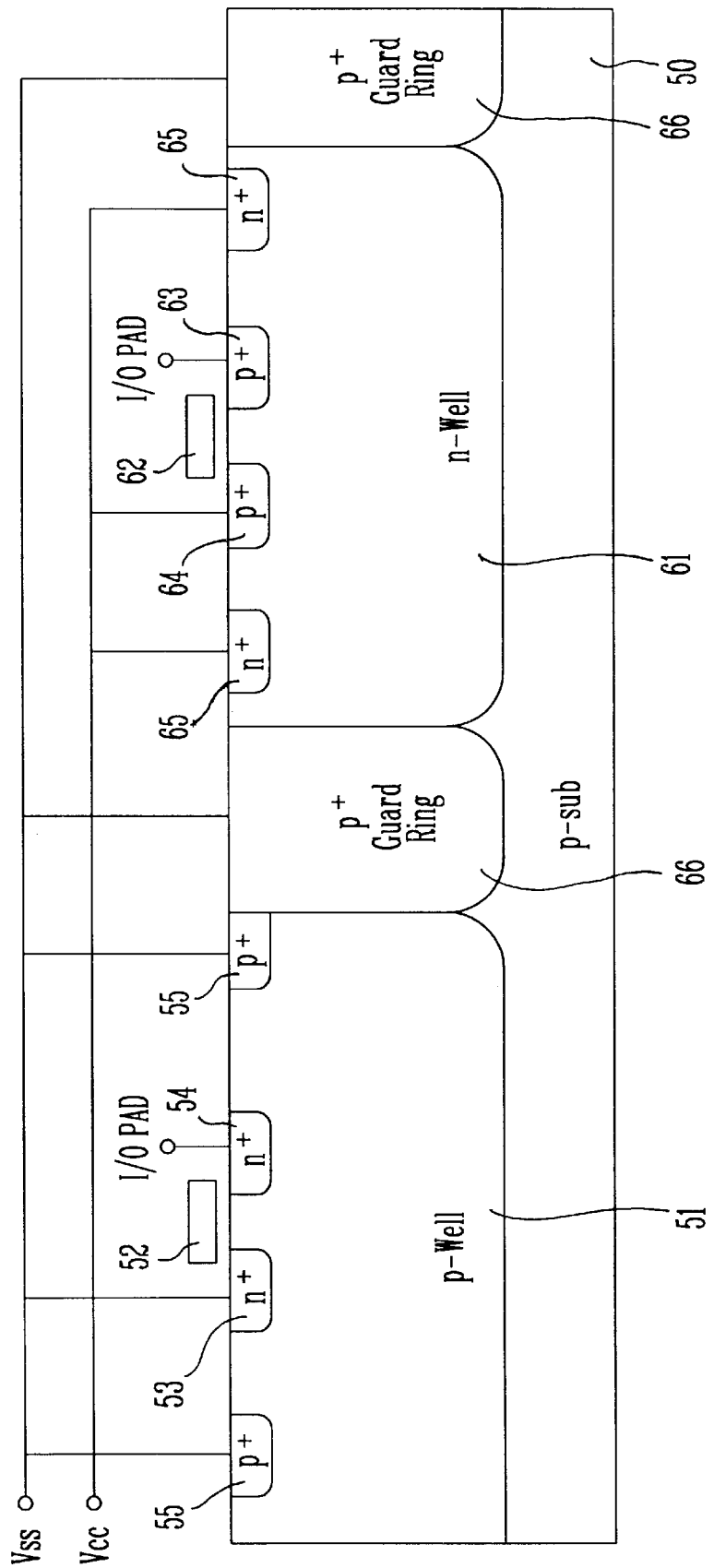
FIGS. 14–15 are sectional views of a structure consistent with the device of FIG. 4.
Figure 15:
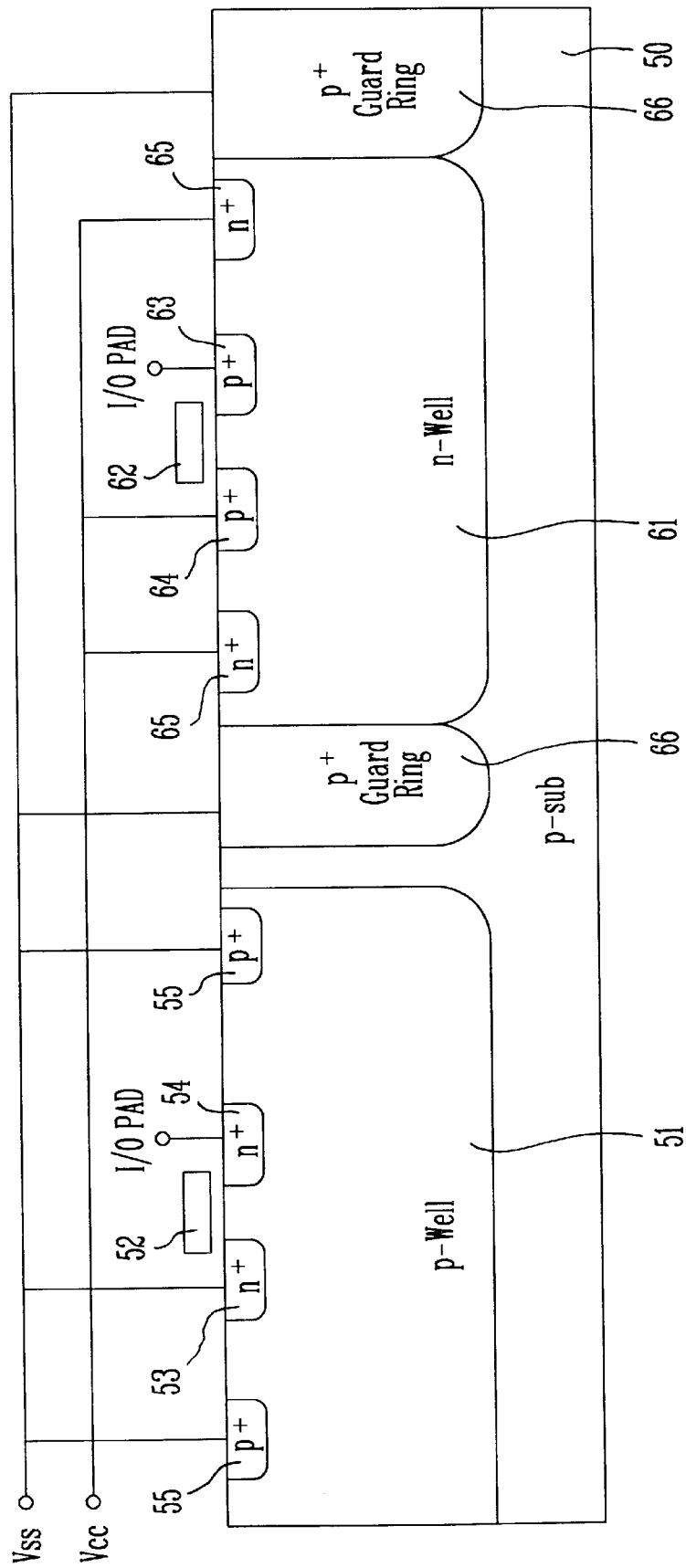

Referring to FIGS. 14 and 15, a p-well 51 and an n-well 61 are formed on a p-type semiconductor substrate 50. Then, a first gate electrode 52, a first source 53, a first drain 54 and a p$^+$ pick-up 55 are formed in the p-well 51, thereby forming an NMOS transistor. Then a second gate electrode 62, a second source 63, a second drain 64 and a p$^+$ pick-up 65 are formed in the n-well 61, thereby forming a PMOS transistor. Then a p$^+$ guard ring 66 is formed around the n-well 61. The first drain 54 and the second source 63 are connected to an input/output pad (I/O pad). The second drain 64 and the p$^+$ pick-up 65 are connected to a power source voltage Vcc. At a positive mode of the ground voltage, the p$^+$ guard ring 66 and the p$^+$ pick-up 65 are metal-strapped, in such a manner that a PNPN path should be formed toward the PMOS transistor. The p$^+$ guard ring 66 and the p$^+$ pick-up 55 thus strapped and the first source 53 are connected to the ground voltage Vss.

In the above, the NMOS transistor is a pull-down NMOS transistor, and the PMOS transistor is a pull-up PMOS transistor. Or the NMOS transistor is an NMOS field transistor, and the PMOS transistor is a PMOS field transistor.

The p$^+$ guard ring 66 is formed either connected to the p-well 51 and the n-well 61, or is formed isolated from the p-well 51.

Figure 16:
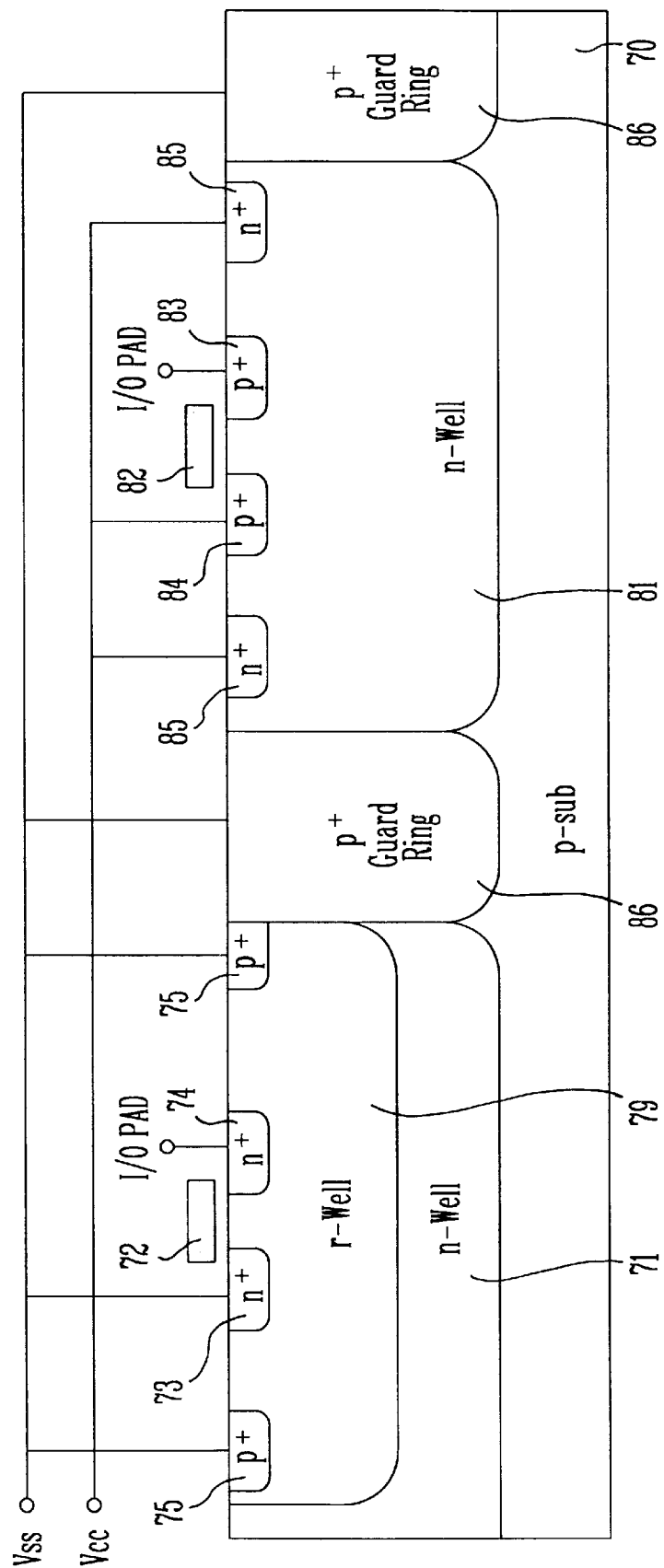
FIGS. 16–21 are sectional views of a structure consistent with the device of FIGS. 9A–9H.
Figure 17:
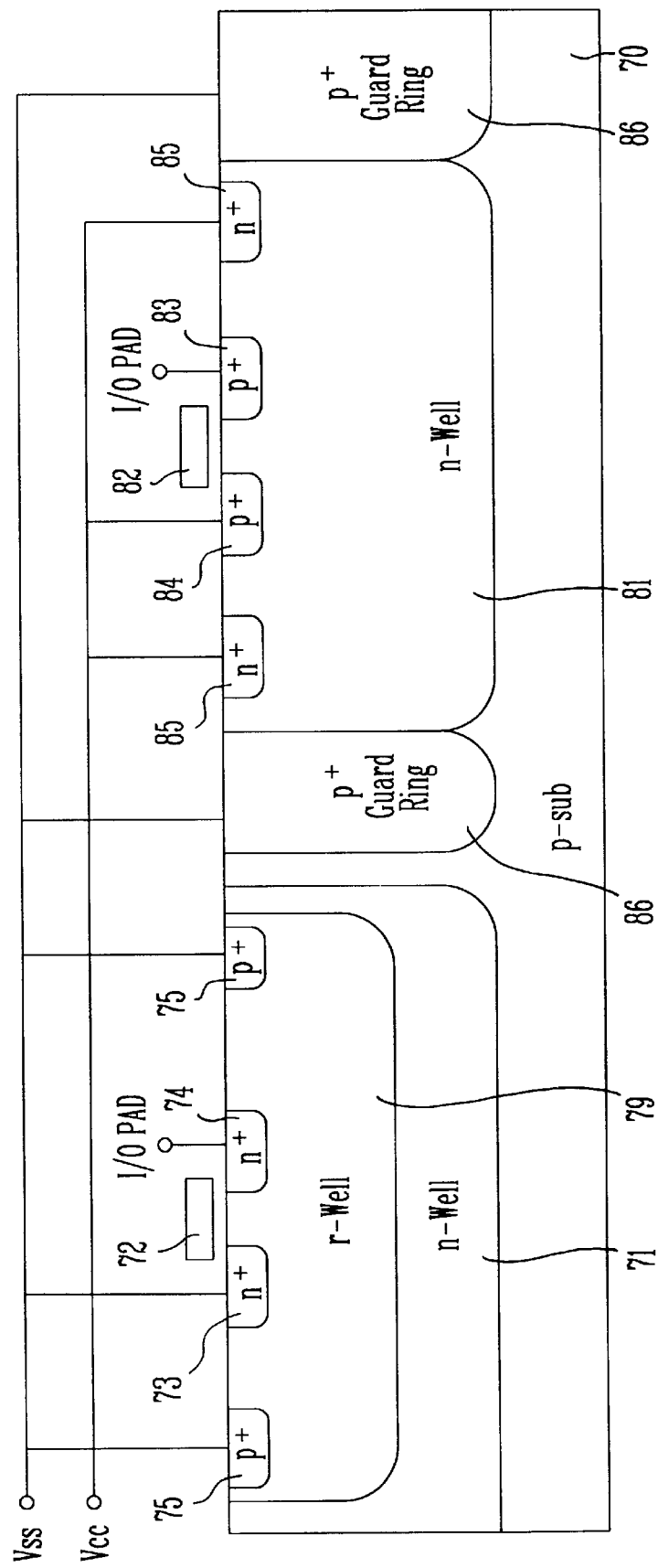
Figure 18:
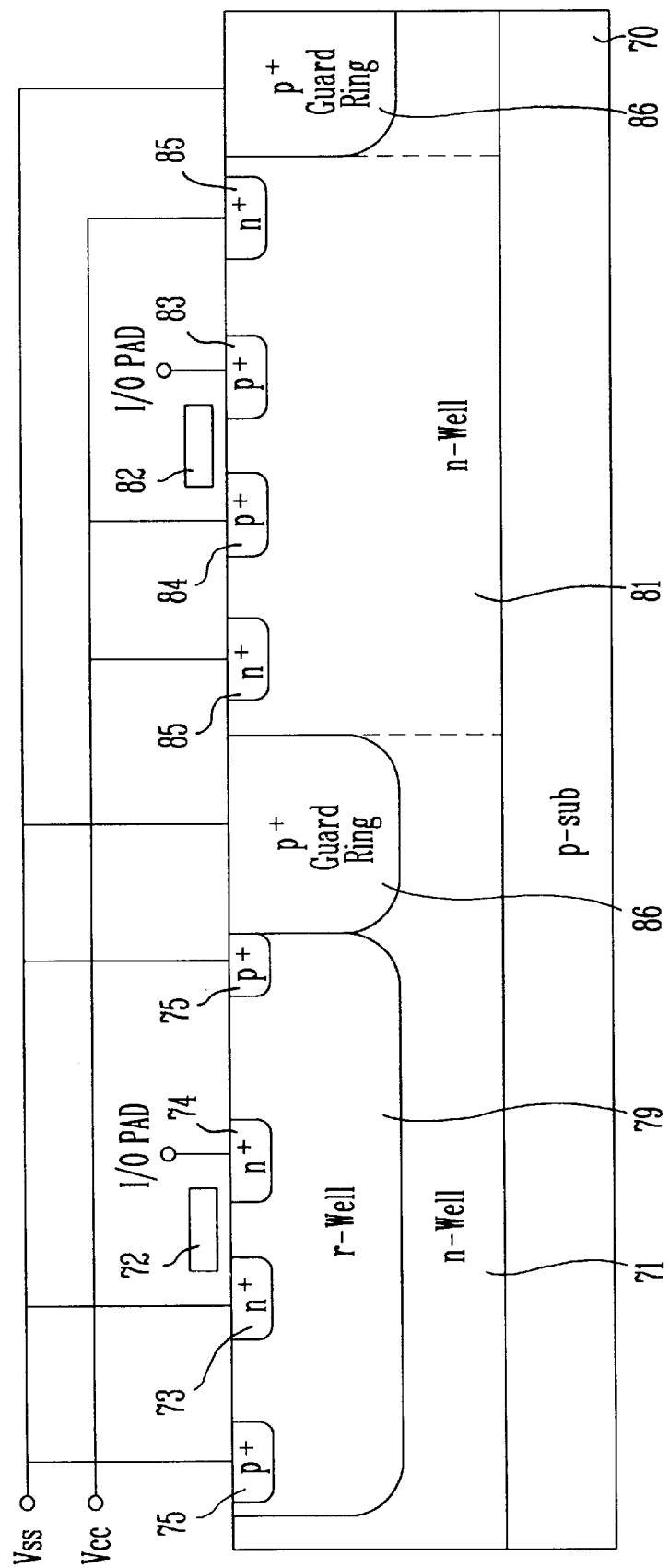
Figure 19:
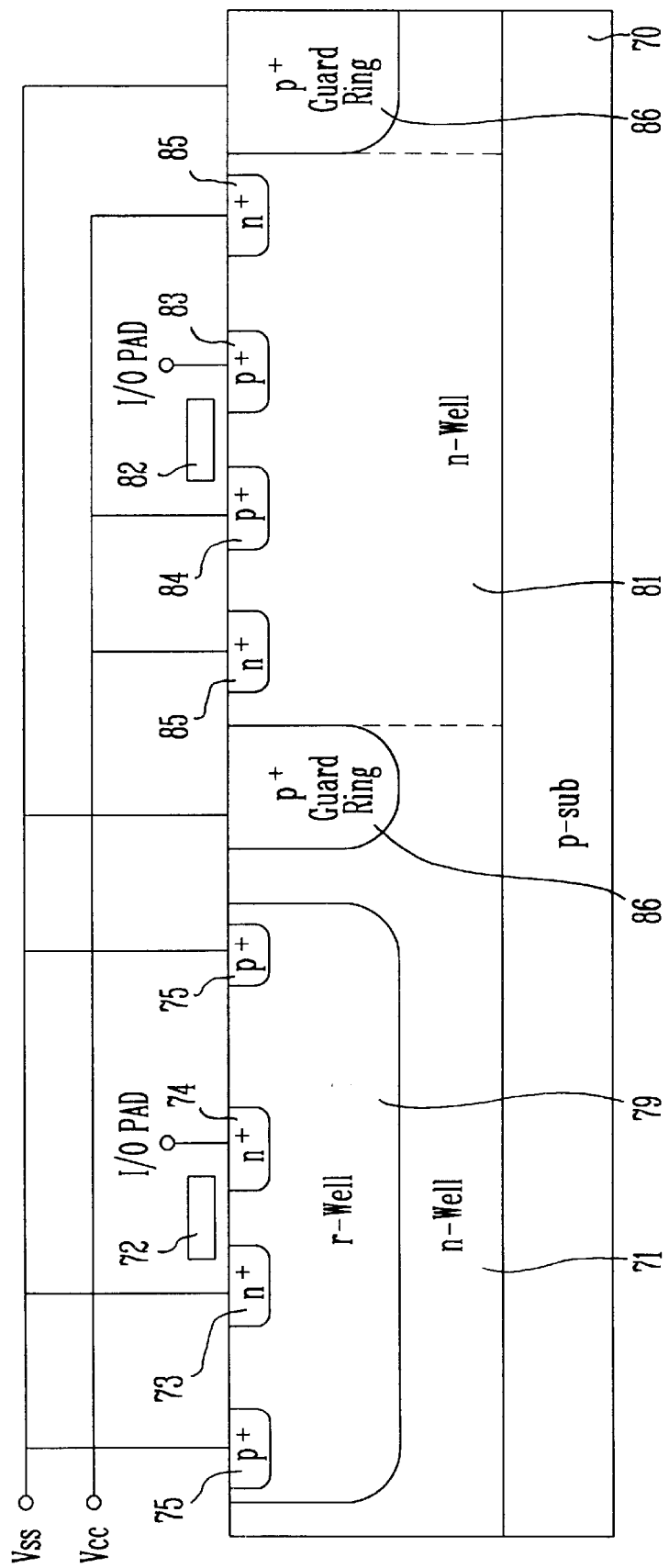

Referring to FIGS. 16 and 19, an r-well 79, a first n-well 71 and a second n-well 81 are formed on a p-type semiconductor substrate 70. Then, a first gate electrode 72, a first source 73, a first drain 74 and a p$^+$ pick-up 75 are formed in the r-well 79 in which the first n-well 71 has been formed, thereby forming an NMOS transistor. Then a second gate electrode 82, a second source 83, a second drain 84 and an n$^+$ pick-up 85 are formed in the second n-well 81, thereby forming a PMOS transistor. Then a p$^+$ guard ring 86 is formed around the second n-well 81. The first drain 74 and the second source 83 are connected to an input/output pad (I/O pad). The second drain 84 and the n$^+$ pick-up 84 are connected to a power source voltage Vcc. At a positive mode of the ground voltage, the p$^+$ guard ring 86 and the p$^+$ pick-up 75 are metal-strapped, in such a manner that a PNPN path should be formed toward the PMOS transistor. The p$^+$ guard ring 86 and the p$^+$ pick-up 75 thus strapped and the first source 73 are connected to the ground voltage Vss.

In the above, the NMOS transistor is a pull-down NMOS transistor, and the PMOS transistor is a pull-up PMOS transistor. Or the NMOS transistor is an NMOS field transistor, and the PMOS transistor is a PMOS field transistor.

The p$^+$ guard ring 86 is connected to the first n-well/r-well 71 and 79 and to the second n-well 81, and is connected to the p-type substrate 70. Or it is isolated from the first n-well 71 and the r-well 79, but is connected to the p-type substrate 70. Or it is connected to the r-well 79 and the second n-well 81, but is isolated from the p-type substrate 70 by the first n-well 71. Or it is isolated from the r-well 79 and is isolated from the p-type substrate 70 by the first n-well 71.

Figure 20:
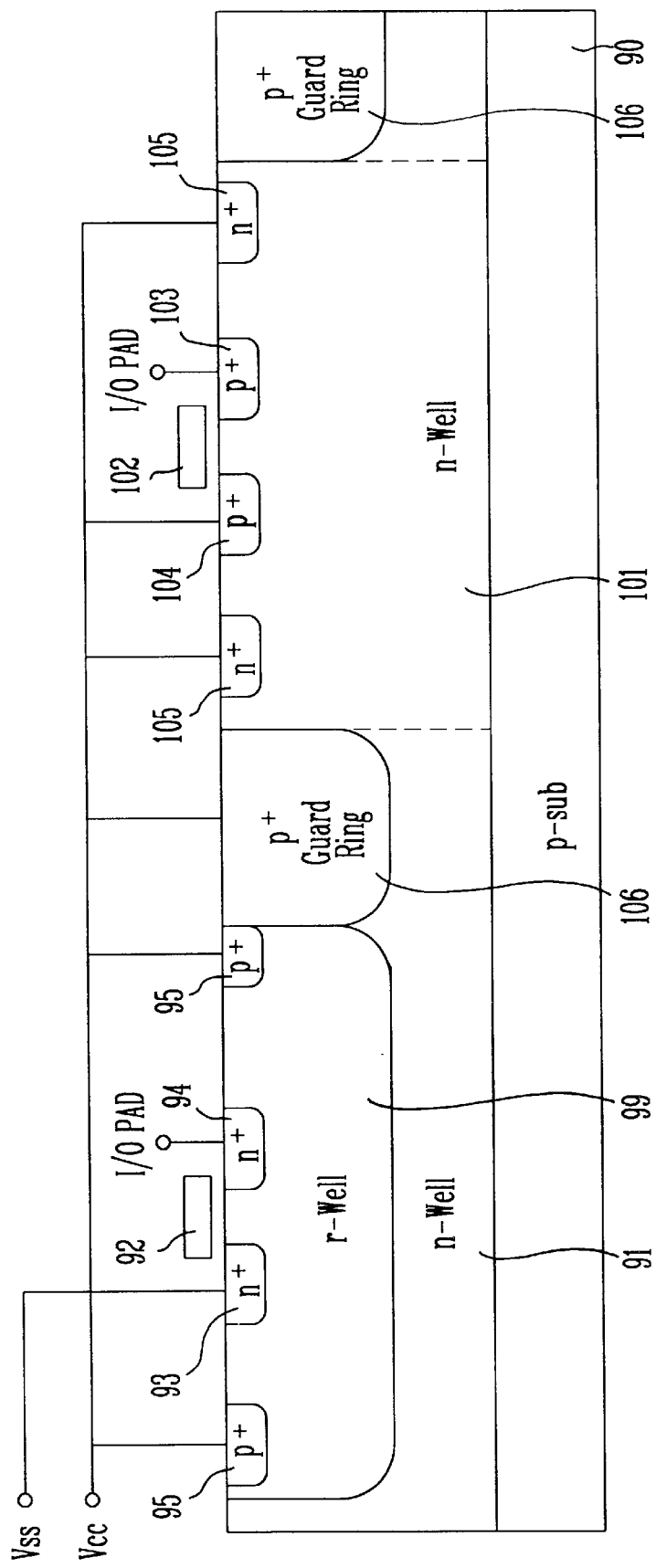
Figure 21:
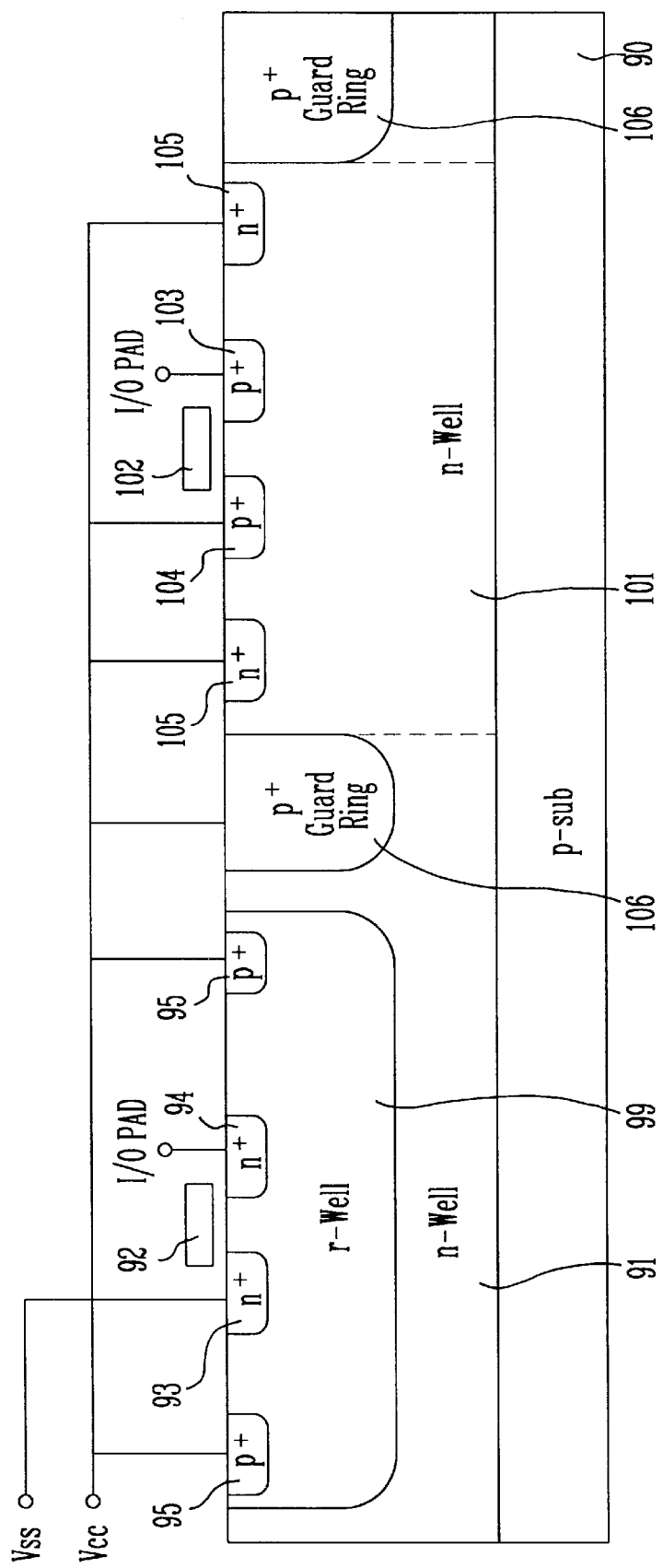

Referring to FIGS. 20 and 21, an r-well 99, a first n-well 91 and a second n-well 101 are formed on a p-type semiconductor substrate 90. Then, a first gate electrode 92, a first source 93, a first drain 94 and a p$^+$ pick-up 95 are formed in the r-well 99 in which the first n-well 91 has been formed, thereby forming an NMOS transistor. Then a second gate electrode 102, a second source 103, a second drain 104 and an n$^+$ pick-up 105 are formed in the second n-well 101, thereby forming a PMOS transistor. Then a p$^+$ guard ring 106 is formed around the second n-well 101, and the p-type substrate 90 is isolated from the first n-well 91. The first drain 94 and the second source 103 are connected to an input/output pad (I/O pad). The first source 93 is connected to the ground voltage. At a positive mode of the ground voltage, the p$^+$ guard ring 106 and the p$^+$ pick-up 95 are metal-strapped, in such a manner that a PNPN path should be formed toward the PMOS transistor. The p$^+$ guard ring 106 and the p$^+$ pick-up 95 thus strapped and the second drain 104 and the n$^+$ pick-up 105 are connected to the power source voltage Vcc.

In the above, the NMOS transistor is a pull-down NMOS transistor, and the PMOS transistor is a pull-up PMOS transistor. Or the NMOS transistor is an NMOS field transistor, and the PMOS transistor is a PMOS field transistor.

The p$^+$ guard ring 106 is either connected to the r-well 99 and the second n-well 101, or is isolated from the r-well 99.

According to the present invention as described above, an n-well guard ring is formed around the NMOS transistor, and this is strapped together with an n-well of a PMOS transistor. Thus at a positive mode of the ground voltage, a PNPN path is formed toward the PMOS transistor. In this manner, the conventional diode between the power source voltage and the ground voltage is eliminated, and thus, the layout area of the semiconductor device is reduced, as well as improving the reliability of the semiconductor device.

What is claimed is:

1. A semiconductor device with an ESD protective circuit, comprising:

a p-well and an n-well formed on a p-type semiconductor substrate;

a first gate electrode, a first source, a first drain and a p$^+$ pick-up formed in said p-well, to form an NMOS transistor;

a second gate electrode, a second source, a second drain and an n⁺ pick-up formed in said n-well, to form a PMOS transistor;

an n-well guard ring formed around said p-well;

said first drain and said second source being connected to an input/output pad;

said first source and said p⁺ pick-up being connected to a ground voltage; and said n-well guard ring and said n⁺ pick-up being metal-strapped together at a positive mode of the ground voltage, whereby a PNPN path is formed toward said PMOS transistor, and said n-well guard ring and said n⁺ pick-up thus strapped and said second drain are connected to a power source voltage.

2. The semiconductor device as claimed in claim 1, wherein said NMOS transistor is a pull-down NMOS transistor, and said PMOS transistor is a pull-up PMOS transistor.

3. The semiconductor device as claimed in claim 1, wherein said NMOS transistor is an NMOS field transistor, and said PMOS transistor is a PMOS field transistor.

4. The semiconductor device as claimed in claim 1, wherein said n-well guard ring is provided with a n⁺ diffusion layer for carrying out a metal strapping.

5. The semiconductor device as claimed in claim 1, wherein said n-well guard ring is formed separately from said n-well by doping a n⁺ impurity.

6. The semiconductor device as claimed in claim 1, wherein said n-well guard ring is connected to said p-well and said n-well.

7. A semiconductor device having an electrostatic discharge (ESD) protective circuit therein, the ESD circuit comprising an NMOS transistor and a PMOS transistor with either an n-well guard ring formed around the NMOS transistor and being strapped to an n-well of the PMOS transistor, or a p⁺ guard ring formed around the PMOS transistor and being strapped to a p⁺ pick-up of the NMOS transistor.

* * * * *